United States Patent [19]

Asano

[11] Patent Number: 5,239,201
[45] Date of Patent: Aug. 24, 1993

[54] SEMICONDUCTOR MEMORY DEVICE

[75] Inventor: Shintaro Asano, Kanagawa, Japan

[73] Assignee: NEC Corporation, Tokyo, Japan

[21] Appl. No.: 982,003

[22] Filed: Nov. 24, 1992

Related U.S. Application Data

[63] Continuation of Ser. No. 779,079, Oct. 18, 1991, abandoned.

[30] Foreign Application Priority Data

Oct. 18, 1990 [JP] Japan .................. 2-279746

[51] Int. Cl.$^5$ .................. H01L 23/48; H01L 27/10; H01L 27/02; H01L 29/04
[52] U.S. Cl. .................. 257/758; 257/211; 257/390; 257/401
[58] Field of Search .......... 257/758, 211, 390, 401, 257/756, 776

Primary Examiner—Mark V. Prenty
Attorney, Agent, or Firm—Sughrue, Mion, Zinn Macpeak & Seas

[57] ABSTRACT

A semiconductor memory device is disclosed which has a multilevel conductor structure including conductors of a lower-level and conductors of an upper-level. The memory device comprises first and second memory cells disposed adjacent to and space from each other, a first conductor at the lower-level included in the first memory cell to constitute the first memory cell and having a portion formed along the space between the memory cells, a second conductor at the lower-level included in the second memory cell to constitute the second memory cell and having a portion formed along the space between the memory cells, a third conductor at the upper-level formed to pass along the space between the first and second memory cells, and a dummy conductor at the lower-level formed under the third conductor to lie between the portion of the first conductor and the portion of the second conductor.

12 Claims, 8 Drawing Sheets

SEMICONDUCTOR MEMORY DEVICE

This is a continuation of application Ser. No. 07/779,079 filed Oct. 18, 1991 and now abandoned.

BACKGROUND OF THE INVENTION

1. Field of the Invention

This invention relates to a semiconductor memory device, and more particularly to a structure of multiple interconnection layers in the memory cell array area of the random access memory (referred to as RAM hereinafter).

2. Description of the Prior Art

In general a semiconductor memory device consists of a memory cell array and peripheral circuits such as decoder circuits and select circuits. Notably in the memory cell array area, there is a number of regularly arranged MOS transistors which memory cells are composed of.

On the other hand, for RAMs, particularly static RAM (SRAM), power line Vcc and ground line GND are required to be disposed between memory cells in the memory cell array area, and thereby the arrangement of MOS transistors is compelled to get out of regularity locally in the vicinity of the connection lines.

MOS transistors which the memory cells are constructed of are multiple interconnection layers each being formed in a regular interconnection pattern in the memory cell array area, and this interconnection pattern is put out of the regularity locally in the vicinity of those connection lines.

The inventors have discovered that variation of dimensions from the design value is greater in such an interconnection layer of locally irregular pattern than in the regular pattern interconnection layer. A dimension of the polycrystalline silicon interconnection layer greater than the design value would result in a greater gate length of MOS transistor (FET) formed on a substrate than the design value, which in turn leads to reduction of the mutual conductance.

The reduction of mutual conductance of the transistor may reflect not only a delayed rising of the digit line potential, lowering of the response speed of the memory device but also cause malfunction.

BRIEF SUMMARY OF THE INVENTION

Objects of the Invention

It therefore is the principal object of the present invention to provide a semiconductor memory device of a structure not allowing increase in gate lengths of transistors due to the disposition of connection lines in the vicinity of them in the memory cell array area, thereby decrease in mutual conductance, lowering of the response speed, and the occurrence of malfunction can be prevented.

Summary of the Invention

A semiconductor memory device according to the present invention comprises a random access memory including a memory cell array consisting of a number of memory cells arranged in row and column, each memory cell including a plurality of transistors and being, in the memory cell array area on a semiconductor substrate, constructed of multiple interconnection layers separated by insulating layers therebetween, and the upper conductor layer and lower interconnection layers of the transistors, each, consisting of electrode regions and connection regions; select means for electrically selecting a memory cell through the conductor layer in the array unit of the column and row directions; and data access means for controlling to obtain data from and put data into the selected memory cell; the components of at least one of the select means and the data access means disposed in the neighborhood to a part of the memory cell array, wherein the electrode regions and connection regions of the transistors, the first and second memory cell arrays of the memory cell array disposed in the neighborhood of the part of the memory cell array composed of the transistors, are formed in the lower conductor layer; dummy connection regions having no electric connection to the electrode regions and to the connection regions are formed in the lower conductor layer between the cells of the first and second memory cell arrays; and either of the select means and the data access means is formed in the upper interconnection layer between the first and second memory cell arrays to connect electrically between the dummy connections and the select means.

BRIEF DESCRIPTION OF THE DRAWINGS

The above-mentioned and other objects, features and advantage of this invention will become more apparent by reference to the following detailed description of the invention taken in conjunction with the accompanying drawings, wherein.

DETAILED DESCRIPTION OF THE INVENTION

Figure 1:
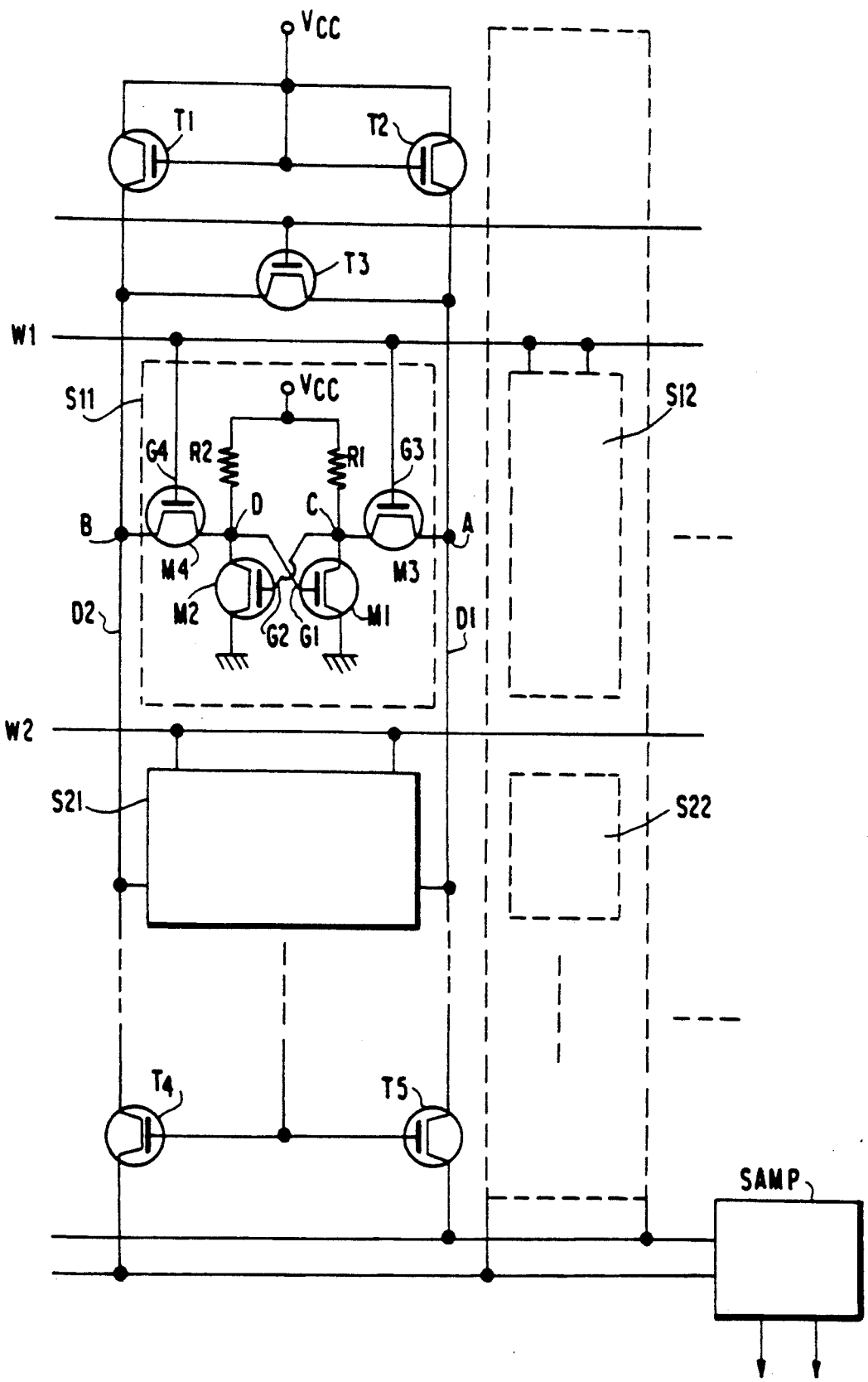
FIG. 1 is a circuit diagram of an example of SRAM in the prior art.

Referring to FIG. 1 showing a circuit diagram of a prior art SRAM comprising memory cells each including nMOS transistors, there are arranged in the memory cell area memory cells S11, S12, S21, S22 in row and column directions. Each memory cell is connected to a word line running in the row direction, for example, S11 and S12 to a word line W1, and S21 and S22 to another word line W2. Each memory cell is also connected to a pair of digit lines D1, D2 running in the column direction, for example, memory cells S11 and S21 are connected to digit lines D1 and D2. Between digit lines D1 and D2 are connected a load circuit consisting of transistors T1 and T2 and a balancing circuit consisting of a transistor T3 at the gate electrode of which signal $\phi$ is input. There are further provided switch transistors T4 and T5 connected to digit line pair D1, D2, respectively, to construct a column select circuit, and a sense amplifier SAMP connected to the column select circuit to amplify the potential difference of a selected digit line pair.

Each memory cell S11, S12, S13, S14, . . . is constructed of a flip-flop circuit composed of a cross-coupled pair of inverters, one of which is the first inverter circuit consisting of a transistor M1 and a resistor R1, and the other is the second inverter circuit consisting of a transistor M2 and a resistor R2. There are further provided a transfer gate (access) transistor M3 of which the source, drain and gate electrodes are connected to one input/output terminal of this flip-flop circuit or the node C of the first inverter circuit, digit line D1, and word line W1, respectively, and another transfer gate (access) transistor M4 of which the source, drain and gate electrodes are connected to the other input/output terminal of the flip-flop circuit or the node D of the second inverter circuit, digit line D2, and word line W1, respectively.

Which data of 0 or 1 is stored into the memory cell depends on whether the complementary potentials of nodes C and D are HIGH and LOW, respectively, or vice versa.

In read mode of SRAM the selected word line, for example, W1, is activated, transfer gate transistors M3, M4 are turned on, and nodes C and D are connected to digit lines D1 and D2, respectively. Of the potentials on these two digit lines, one is lowered in response to the data stored on the memory cell or the potentials of the nodes of C and D to produce a potential difference between both. This potential difference is amplified by sense amplifier SAMP, and sent out to an output circuitry (not shown).

In write mode, a potential difference corresponding to a data is impressed between digit lines D1 and D2, and thereby transfer-gate transistors M3 and M4 are turned on, whereby nodes C and D are set to the potentials.

Figure 2:
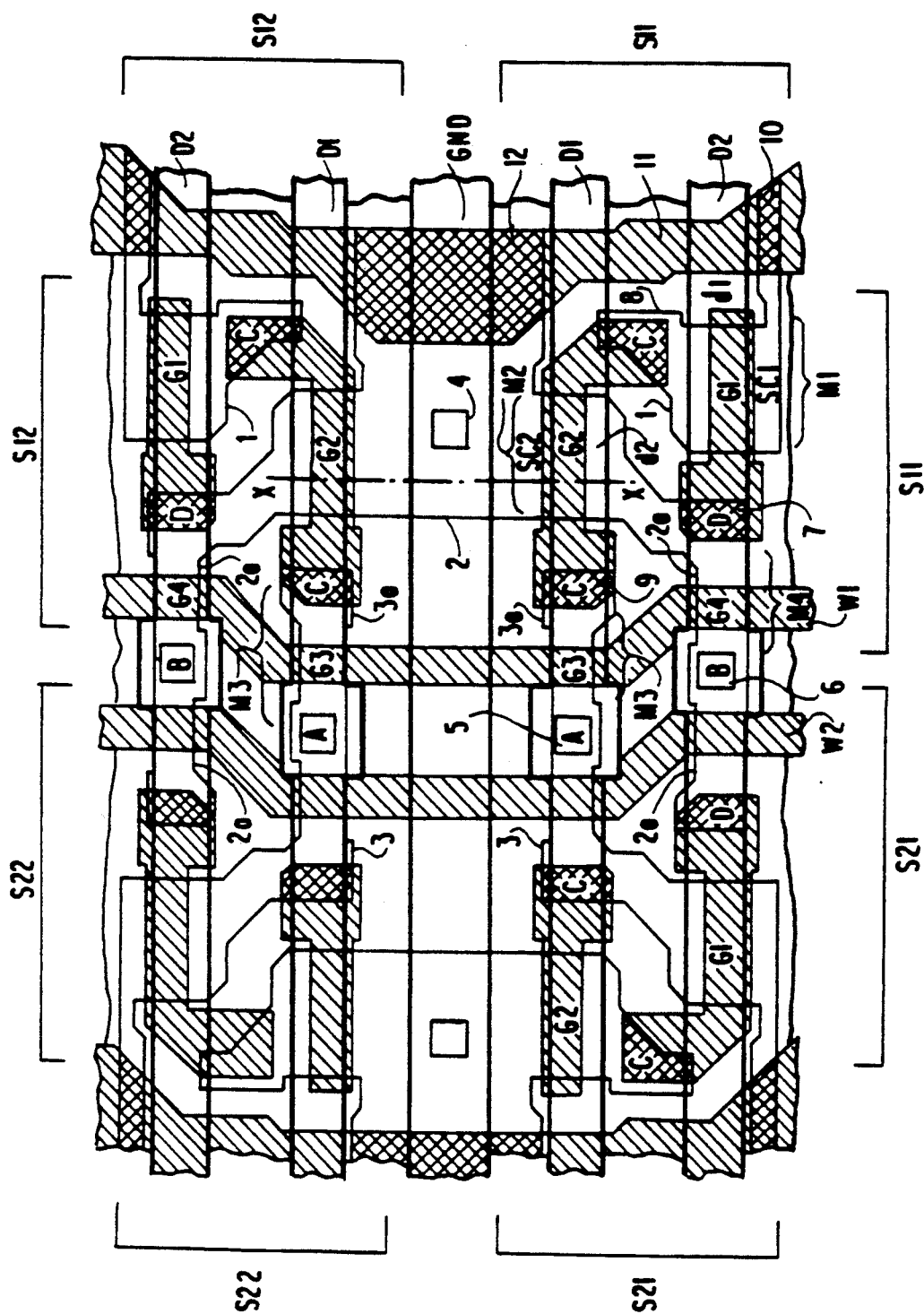
FIG. 2 is a circuit pattern including FETs and other circuit elements in the concerned part of the memory cell array area of the SRAM of FIG. 1.

The circuit pattern which a part of the memory cell array area of the SRAM of FIG. 1 has is shown in FIG. 2 where the designation of components and parts by reference characters is the same as in FIG. 1, and slender solid lines define active regions which is partitioned by selective-oxidization field oxide films, hatchings define polycrystalline silicon regions in the upper layer with relation to the active regions, cross-hatchings define direct contact regions in each of which a polycrystalline region and an active region are placed in direct contact with each other, and bold solid lines define aluminium interconnection in the upper layer with relation to the polycrystalline silicon regions.

Transistor M1 is provided in active region 1, and its gate electrode G1 made of polycrystalline silicon film is connected to drain region d2 (node D) of transistor M2 via direct contact 7. Its source region sc1 is connected to polycrystalline silicon region 11 via direct contact 10, and its drain region d1 is connected to gate electrode G2 (node C) of transistor M2 made of polycrystalline silicon film via direct contact 8.

Transistor M2 is provided in active region 2, and its source region scS2 is connected to polycrystalline silicon region 11 via direct contact 12 and also to ground line GND made of aluminium film via contact hole 4.

Transistor M3 is provided in activae region 3 a extending from active region 3, and its source and drain are formed between contact hole 5 (node A) connected to digit line D1 and direct contact 9 (node C) connected to gate electrode G2 of transistor M2. Its gate electrode G3 is formed as the inter-crossed region of word line W1 made of polycrystalline silicon film and active region 3a.

Transistor M4 is provided in an active area 2a extending from active region 2 and running parallel to the lengthwise direction of active region 3a. Its source and drain are formed between a contact hole 6 (node B) connected to digit line D2 and a direct contact 7 (node D) connected to gate electrode G1 of transistor M1. Its gate electrode G4 is formed in the inter-crossed region of word line W1 made of polycrystalline silicon film and active region 2a.

Besides load resistors R1, R2 and power line Vcc (these are not shown in FIG. 2) are formed in memory cell array area by the well-known process as polycrystalline silicon film in the layer different in level from the polycrystalline silicon films constructing the transistor.

Memory cell S11 is composed of transistors M1 through M4, load resistors R1 and R2, and interconnection among these circuit elements as described above. Memory cells S12, S21 and S22 which have the same circuit configuration as S11 are formed in conjunction with S11 in the same process, and detailed description of them is omitted.

Generally in the memory cell array area of SRAM there are provided one power connection line Vcc and one ground connection line GND per 6 to 12 memory cells between the memory cells. In SRAM shown in FIG. 2, a ground connection line GND is formed in the uppermost aluminium interconnection layer with relation to the active regions and polycrystalline silicon layer so as to run lengthwise (FIG. 1) between memory cells S11 and S12 and between memory cells S21 and S22.

As described above, in the memory cell array area in which memory cells are arranged in the row and column directions, the majority of polycrystalline silicon regions which serve as the word lines and as the gates of the transistors is formed in regular circuit pattern. For the example of FIG. 2, polycrystalline silicon regions serving as components of transistors M1, M2, M3 and M4 are formed in regular interconnection pattern in the memory cell array area.

Figure 3:
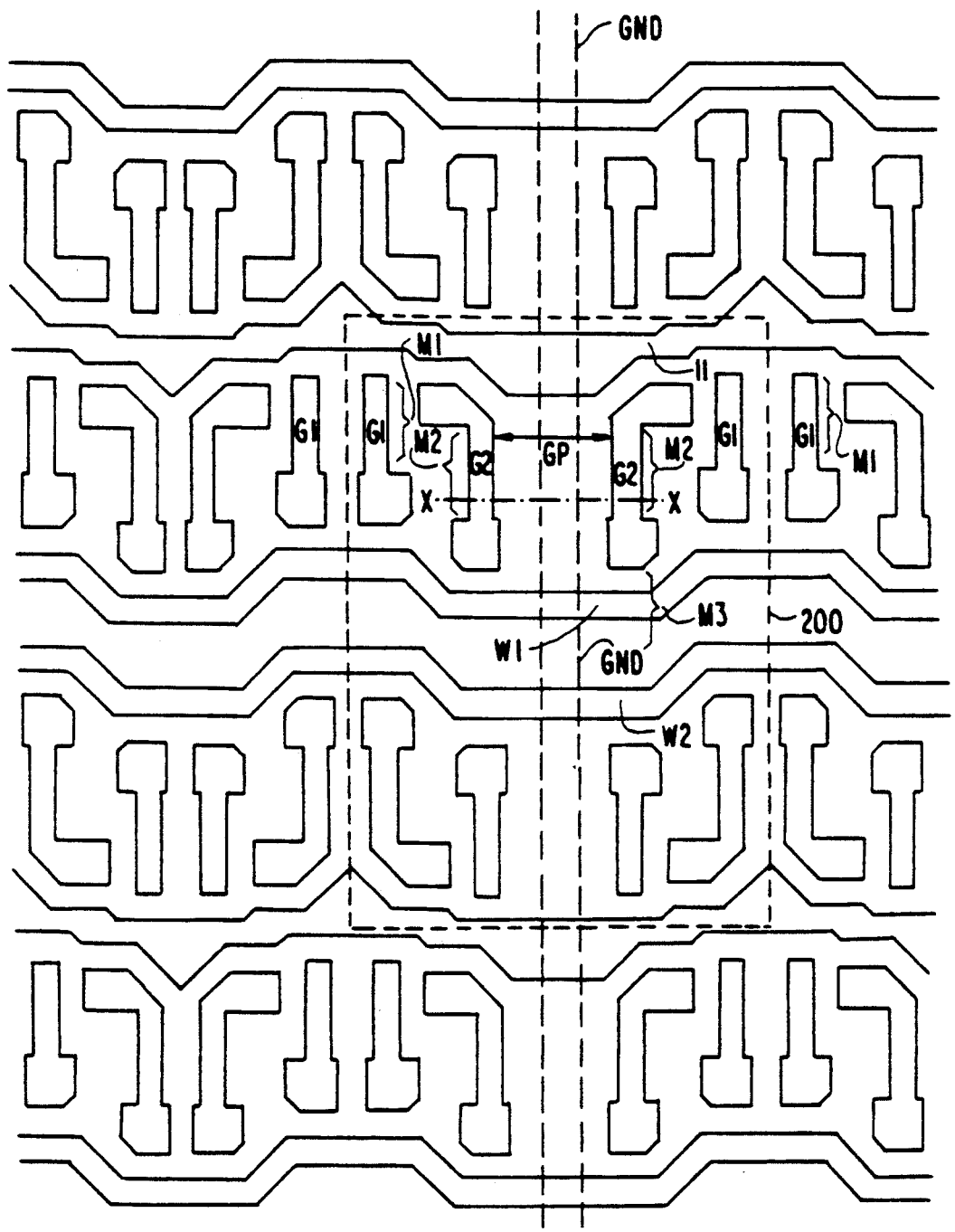
FIG. 3 is a plan view illustrative of the interconnection pattern of the polycrystalline silicon interconnection layer in the concerned part of the memory cell array area.

Referring to FIG. 3 showing only interconnection pattern of polycrystalline silicon layer in a portion of the memory cell array area including the area of FIG. 2 and its vicinity, the area of FIG. 2 being defined by dash line and indicated by a numerical reference 200, the interconnection pattern of polycrystalline silicon layer in which gate electrodes G1 and G2 of transistors M1 and M2, respectively, are formed is regular except the zone including the area shown in FIG. 2 (referred to as 'ground line zone' hereinafter). In this zone, the arrangement of the transistors is out of the regular pattern because of the disposition of ground line GND just above the ground line zone in the higher-level aluminium interconnection layer indicated by dash line in FIG. 3.

For example, because of the disposition of a ground line GND made of aluminium film running in the column direction between memory cells S11 and S21 and between S12 and S22 (FIG. 1), as stated above with reference to FIG. 2, the width GP (FIG. 3), for example, between the opposed polycrystalline silicon regions serving as gate electrodes G2, G2 of transistors M2, M2 of memory cells S11, S12, respectively, is greater than in the neighborhood of this ground line zone, that is to say, arrangement or interconnection pattern of polycrystalline silicon region is out of the regularity from the viewpoint of the abovementioned width.

Figure 4:
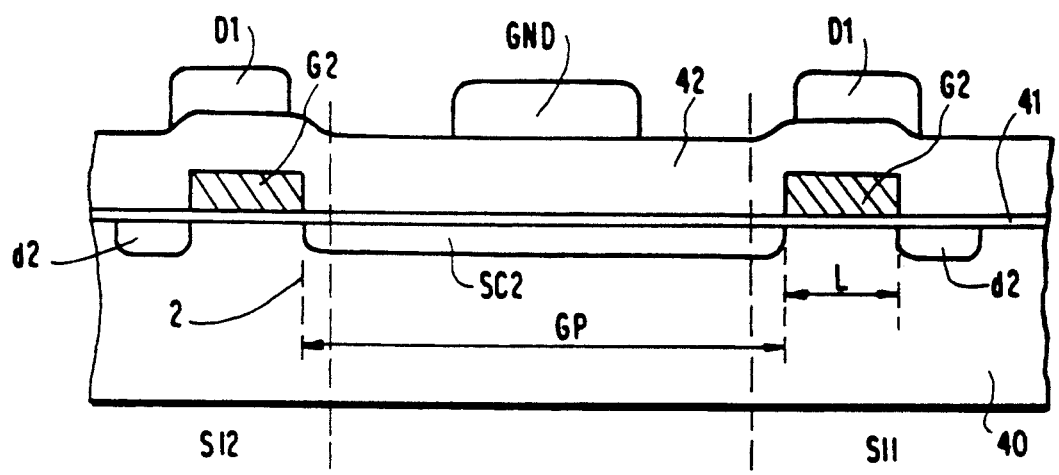
FIG. 4 is a cross-sectional view along line X—X of FIGS. 2 and 3.

Referring to FIG. 4 which is a cross section along line X—X of FIGS. 2 and 3, in the active area 2 on p-type silicon substrate 40, there are formed source and drain regions, designated by sc2 and d2, respectively, of transistor M2 of memory cell S11 by diffusion. Their respective gate electrodes G2, G2 made of polycrystalline silicon are formed on oxide film 41 serving as gate insulating film on the surface of the substrate. The source, drain and gate regions of transistor M2 of memory cell S12 are formed in the same process as are done those of transistor M2 of memory cell S11. The width of the gate electrodes G2, G2 of those transistors is called gate length L. After completing gate electrode G2 interconnection, the whole surface of the chip is covered with an insulating layer 42, and thereon a plurality of digit lines D1 and a ground line GND made of aluminium film running between, and parallel to, every pair of digit lines D1, D1 are deposited. There is no interconnection in the polycrystalline silicon layer under the ground line GND, and hence the distance GP between the opposed gate electrode G2, G2 of transistors M2, M2 of memory cells S11, S12, respectively, is greater than in the neighborhood of the ground line zone, as described above, and therefore the polycrystalline silicon interconnection pattern is out of the regularity.

Figure 5:
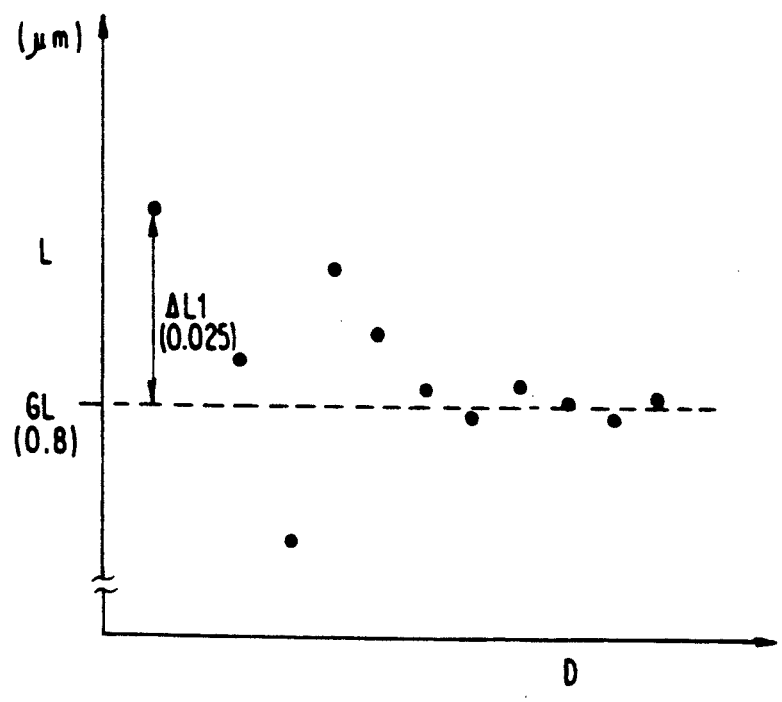
FIG. 5 is a plot of measured values of the FET gate length in the SRAM of FIG. 2 against distance, showing in comparison with the design value.

To exhibit the influence of the deviation from the regularity or the above-mentioned locally-irregular interconnection pattern on the design values of dimensions of the polycrystalline silicon layer, a graph in (FIG. 5) was constructed by plotting, in abscissa, the distance D ($\mu$m) from the polycrystalline silicon region end to the ground power line GND and, in ordinate, gate length L ($\mu$m, FIG. 4) of transistor M2 on the ordinate, and besides the measured results with black dots. It is apparent from FIG. 5 that the measured results are not always the same as the design value GL of gate length L. In other words, as shown in FIG. 5, the width L of polycrystalline silicon region defining the gate length of transistor M2 exhibits the difference ($\Delta L1$) from the design value GL, which becomes greater, as becoming nearer to ground line GND. For example, assuming the design value to be 0.8 $\mu$m, the maximum value of $\Delta L1$ is 0.025 $\mu$m.

Figure 6:
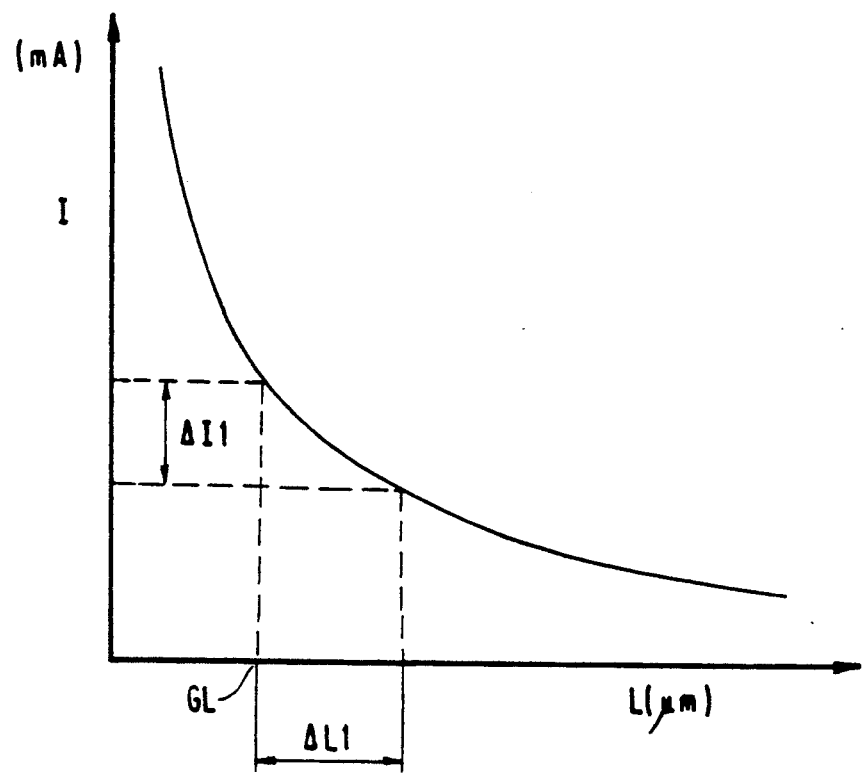
FIG. 6 is a graph showing the relationship between the FET gate length and the drain current.

The gate length L greater than the design value will bring the following problem: As shown in FIG. 6 in which gate length L ($\mu$m) is plotted in abscissa and drain current I (mA) in ordinate, using a gate voltage of 3 V as a parameter, when gate length L is greater by $\Delta L1$ ($\mu$m) than the design value GL (0.8 $\mu$m), the drain current I (mA) will decrease by $\Delta I$. Accordingly, for example, in a device designed to set the drain current to a desired value of 0.648 mA, a deviation of gate length L which is 0.025 $\mu$m greater than the design value will result in a decrease of the drain current by 0.0324 mA or as much as 5% of the desired value. This leads not only to lag in rising of the read output for the memory cell, and in turn to much lowering of the response speed of the memory but also on occasion to occurrence of read error.

Figure 7:
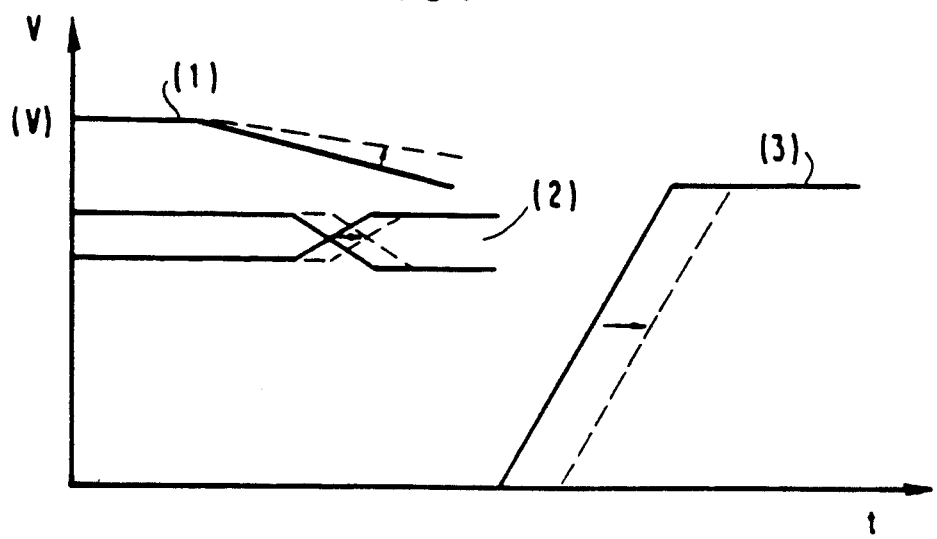
FIG. 7 is waveforms of voltage impressed on a digit line of the SRAM and read voltage.

FIG. 7 shows graphs constructed by plotting time in abscissa and voltage (mV) in ordinate. As apparent from FIG. 7, the as above-mentioned impairment in the performance of the transistor brings (1) potential change of the digit line connected to the transistor to delay (change from solid line to broken line), which in turn brings (2) the output from the sense amplifier amplifying the potential difference of the digit line to delay. Consequently (3) data output time of this SRAM is caused to delay by about 1.7 nsec, which not only results in remarkable lowering of the performance but also may cause read/write error.

These problems are due to variation in dimension of the active area. The above-described deviation of the interconnection pattern from the regularity affects lithography process which comprises in sequence coating a photoresist film, exposure through a mask with a specified pattern and selectively removing polycrystalline silicon film, particularly diffraction of light which is one of the conditions for the exposure. This is the cause of the dimensional variation of polycrystalline silicon regions left selectively after etching, resulting in getting out of uniformity in gate length.

Figure 8:
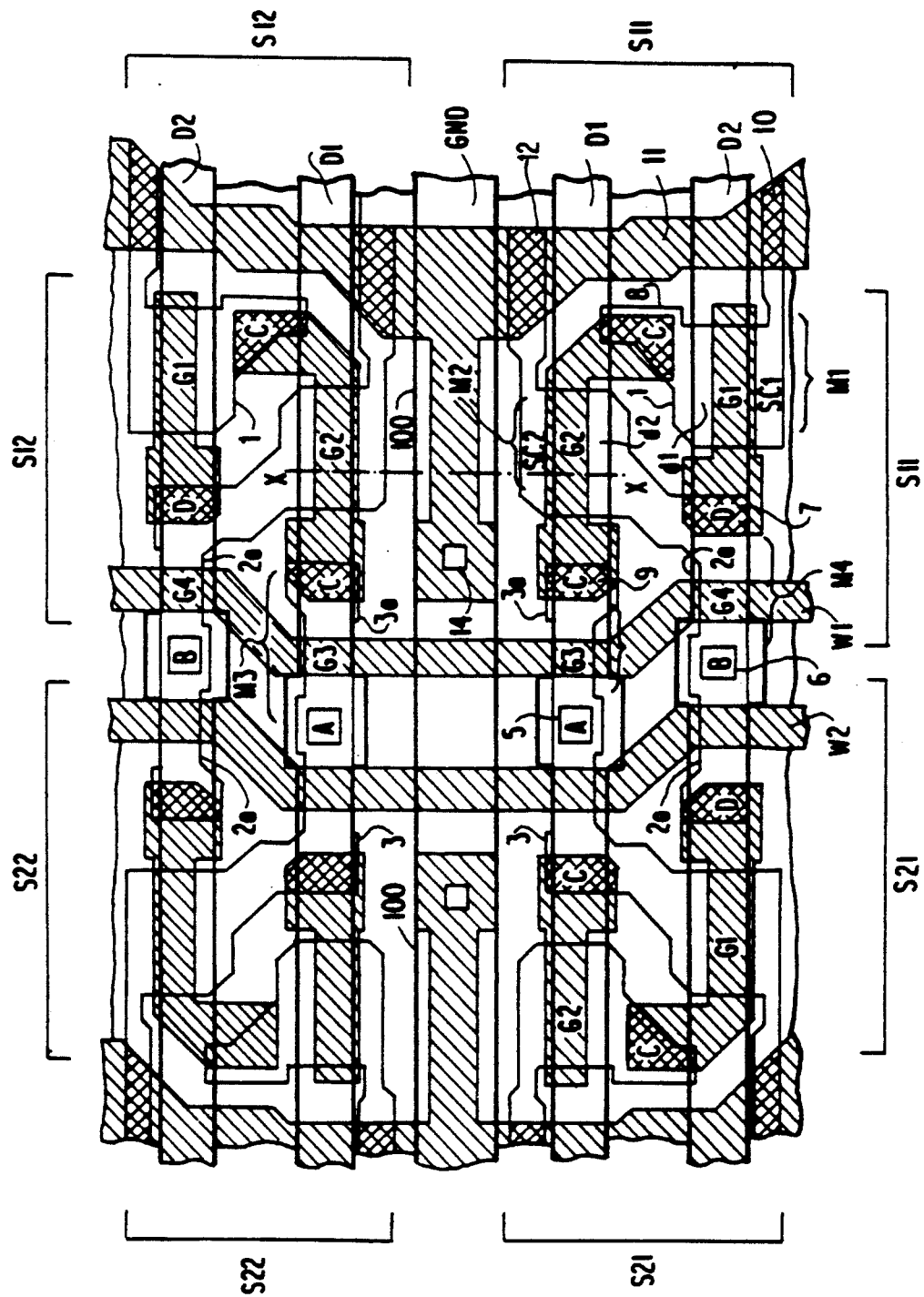
FIG. 8 is the circuit pattern similar to FIG. 2, of a SRAM embodying the present invention.

FIG. 8 shows a circuit pattern of a SRAM embodying the present invention diagrammed in the same way as in FIG. 2, in which components and parts common to those of the prior art SRAM including memory cell pairs S11/S12 and S21/S22 composed of nMOS transistors are designated with the same reference characters.

In contrast to the prior art example shown in FIG. 2, in the present embodiment, a dummy region 100 is disposed between the opposed gate electrodes G2, G2, which are made of polycrystalline silicon film, of transistors M2, M2 on the opposite sides of ground line GND and just under ground line GND.

Referring to FIG. 8 in conjunction with FIG. 9 of polycrystalline silicon interconnection pattern diagrammed as in FIG. 3, this embodiment will be described under. In the process for forming polycrystalline silicon interconnection layer (FIG. 9) one level lower than the aluminium interconnection layer including the ground line GND and separated by the insulating layer (which will be described later) between them, a dummy region 100 is formed just under the ground line GND, in conjunction with gate electrodes G2, G2 (shown in the vicinity of line X—X in FIG. 9 and in the center portion in the right half of FIG. 8) of the aforesaid transistors, and between these electrodes. The dummy region is connected via contact holes 14 to ground line GND.

Figure 9:
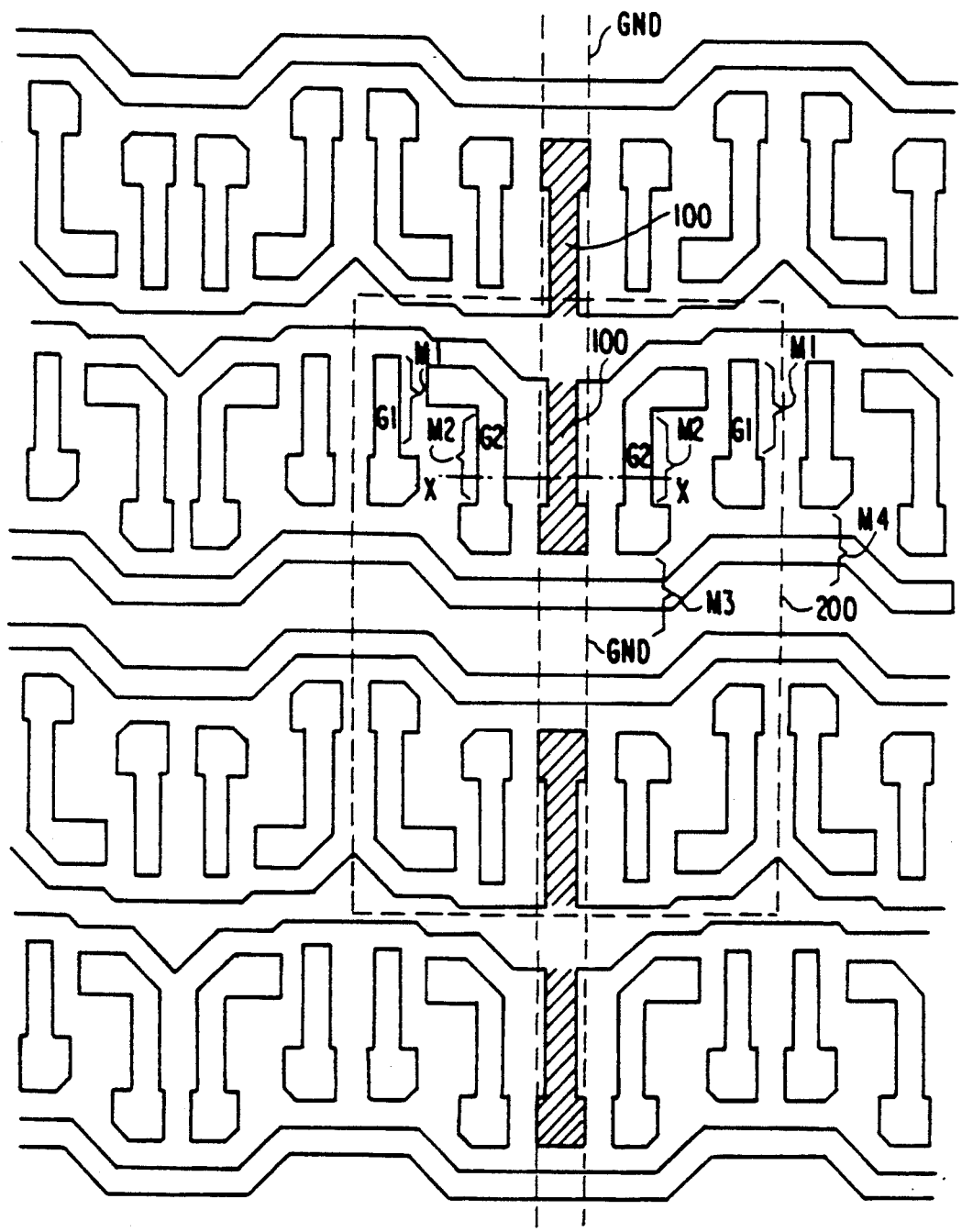
FIG. 9 is a circuit pattern illustrative of the polycrystalline silicon interconnection layer in the concerned part of the memory cell array area.
Figure 10:
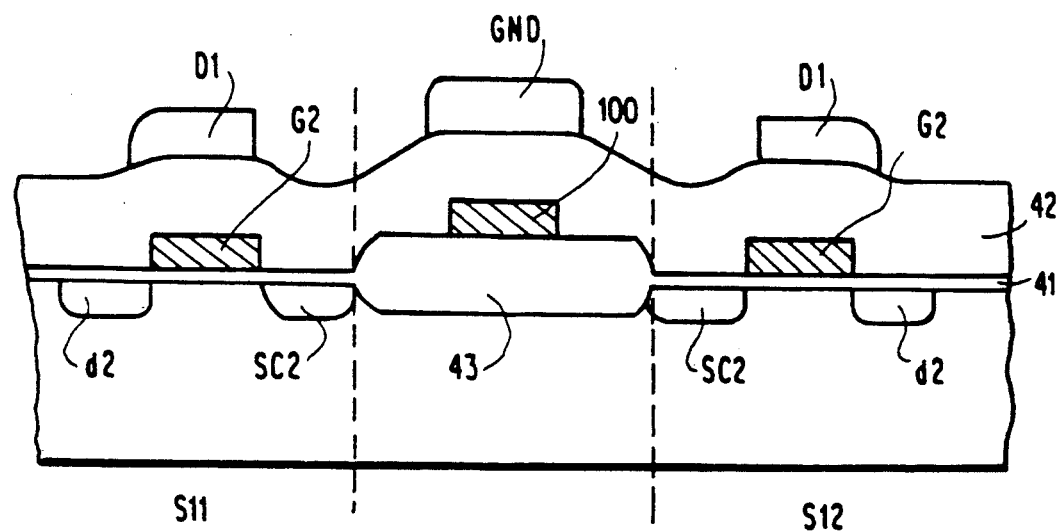
FIG. 10 is a cross-sectional view along line X—X of FIGS. 8 and 9.

Referring to FIG. 10 which is a cross-section along line X—X of FIGS. 8 and 9, a field insulating film 43 is formed in the active area 2 made on a p-type silicon substrate 40 by the field oxidation process between the regions which transistors M2, M2 of memory cells S11, S12 are made of, and thus these regions are separated by the field insulating film 43. In the active area 2 of each memory cell S11, S12, source region sc2 and drain region d2 of transistor M2 are formed by diffusion. Besides the gate electrode G2 made of polycrystalline silicon film is formed on an oxide film 41 formed as the gate oxide film of the transistor.

Moreover a dummy regions 100 of polycrystalline silicon is formed on field insulating film 43, between two gate electrodes G2, G2, and together with these gate electrodes in the same process. Then an insulating layer 41 is formed to cover the whole surface of two gate electrodes G2, G2 and the dummy region 100, and on this insulating layer a pair of digit lines D1, D1 and the ground power line GND are disposed in the direction identical to each other. In this construction of this embodiment, there is disposed a polycrystalline silicon dummy region formed in the same process in conjunction with, and between, the gate electrodes G2, G2 of a pair of transistors M2, M2 adjacent to each other, and thereby the polycrystalline silicon interconnection pattern is compensated to the regularity, leading to a solution to the above-stated problem with device structure involving the prior art.

Figure 11:
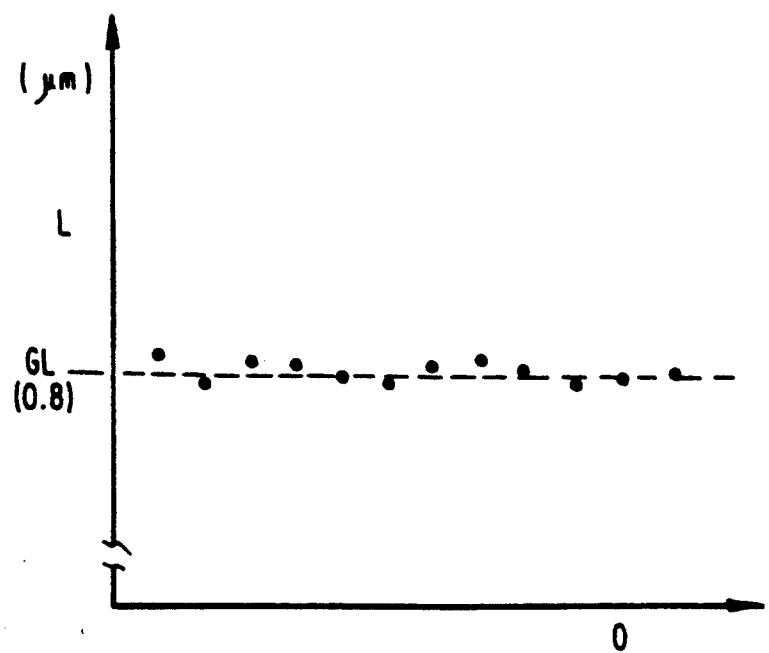
FIG. 11 is a plot of measured gate-length values of FETs in the SRAM of FIG. 8 against distance, showing in comparison with the design value.

Now it is apparent from FIG. 11 showing by plotting, in abscissa, distance D from the edge of the polycrystalline silicon region of the above-mentioned gate electrode G2 to ground line GND, and in ordinate gate length L as in FIG. 5, that the measured results indicated with black dots are practically agreed with the design value GL. According to the present invention therefore reduction of the mutual conductance of the transistors in the memory cell array area due to increase in gate length is prevented, and thereby problems such as the lowering of the response speed and readout errors involving the present SRAM can be brought to solution.

The above-described embodiment is of a SRAM constructed of nMOSs, and the present invention is applicable similarly to SRAMs constructed of pMOSs. For the latter, ground line GND in the circuit pattern of FIG. 8 may be replaced by a power line Vcc connected to power supply voltage Vcc.

Finally it is obvious to persons skilled in the art that the present invention can be applied not only to SRAMs but also to memories including comprising memory cell array(s) in which memory cells are regularly arranged, such as dynamic RAM (DRAM), programmable read only memory (PROM), erasable PROM (EPROM), electrically erasable PROM (EEPROM), shift register, and CCD memory.

Although the invention has been described with reference to specific embodiments, this description is not meant to be construed in a limiting sense. Various modifications of the disclosed embodiment will become apparent to persons skilled in the art upon reference to the description of the invention. It is therefore contemplated that the appended claims will cover any modifications embodiments as fall within the true scope of the invention.

What is claimed is:

1. A semiconductor memory device formed with a multilevel conductive layer structure including conductive layers at a lower-level and conductive layers at an upper-level, said semiconductor memory device comprising first and second memory cells disposed adjacent to and spaced from each other, said first memory cell including a first conductive layer at said lower-level, said first conductive layer having a portion formed along said space between said first and second memory cells, said second memory cell including a second conductive layer at said lower-level, said second conductive layer having a portion formed along said space between said first and second memory cells, a third conductive layer at said lower-level formed to cross said space between said first and second memory cells to electrically connect said first and second memory cells to each other, a fourth conductive layer at said upper-level formed to pass along said space between said first and second memory cells, and a fifth conductive layer at said lower-level elongated from said third conductive layer along said space between said first and second memory cells and under said fourth conductive layer to lie between said portion of said first conductive layer and said portion of said second conductive layer.

2. The semiconductor memory device as claimed in claim 1, wherein said third conductive layer is electrically connected to said fourth conductive layer.

3. The semiconductor memory device as claimed in claim 2, wherein said fifth conductive layer has a contact portion connected to said fourth conductive layer to thereby electrically connect said third conductive layer to said fourth conductive layer.

4. The semiconductive memory device as claimed in claim 3, wherein each of said first, second and third conductive layers and said fifth conductive layer is made of polycrystalline silicon and said fourth conductive layer is made of a metal.

5. The semiconductor memory device as claimed in claim 3, wherein said fourth conductive layer is supplied with a power voltage.

6. A semiconductor memory device having a multilevel conductor structure including a plurality of conductors at a lower-level and a plurality of conductors at an upper-level, said semiconductor memory device comprising first and second memory cells disposed adjacent to and spaced from each other, a field insulating layer formed to define said space between said first and second memory cells, said first memory cell including a first conductor at said lower-level, said first conductor having a portion formed along said field insulating layer, said second memory cell including a second conductor at said lower-level, said second conductor having a portion formed along said field insulating layer, a third conductor at said upper-level formed to pass along said field insulating layer between said first and second memory cells, and a fourth conductor at said lower-level inserted between said field insulating layer and said third conductor to lie between said portion of said first conductor and said portion of said second conductor.

7. The semiconductor memory device as claimed in claim 6, further comprising a fifth conductor at said lower-level formed to pass across said field insulating layer to electrically connect said first and second memory cells to each other, said fifth conductor being electrically connected to said third conductor.

8. The semiconductor memory device as claimed in claim 7, wherein said fourth conductor is connected to said fifth conductor on said field insulating layer, and said fourth conductor having a contact portion connected to said third conductor to electrically connect said fifth conductor to said third conductor.

9. The semiconductor memory device as claimed in claim 6, wherein said first memory cell includes a first transistor and said second memory cell includes a second transistor, said first transistor having a gate formed by said portion of said first conductor, a source region and a drain region, said second transistor having a gate formed by said portion of said second conductor, a source region and a drain region, and said source regions of said first and second transistors being separated from each other by said field insulating layer.

10. The semiconductor memory device as claimed in claim 9, further comprising a fifth conductor at said lower-level formed to pass across said field insulating layer, said source region of said first transistor being connected to said fifth conductor, said source region of said second transistor being connected to said fifth conductor, and said fifth conductor being electrically connected to said third conductor.

11. The semiconductor memory device as claimed in claim 10, wherein said fourth conductor is connected to said fifth conductor on said field insulating layer and has a contact portion connected to said third conductor to thereby electrically connect said fifth conductor to said third conductor.

12. The semiconductor memory device as claimed in claim 11, wherein each of said first, second and fifth conductors and said fourth conductor is made of polycrystalline silicon and said third conductor is made of a metal.

* * * * *